United States Patent
Qian et al.

(10) Patent No.: US 11,811,390 B2
(45) Date of Patent: Nov. 7, 2023

(54) RESONATOR DEVICES AND METHODS OF FABRICATING RESONATOR DEVICES

(71) Applicant: GLOBALFOUNDRIES Singapore Pte. Ltd., Singapore (SG)

(72) Inventors: You Qian, Singapore (SG); Humberto Campanella Pineda, Cork (IE); Rakesh Kumar, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 1220 days.

(21) Appl. No.: 16/403,639

(22) Filed: May 6, 2019

(65) Prior Publication Data
US 2020/0358421 A1 Nov. 12, 2020

(51) Int. Cl.
| H03H 3/02 | (2006.01) |
| H03H 9/13 | (2006.01) |
| H03H 9/17 | (2006.01) |
| H10N 30/06 | (2023.01) |
| H10N 30/09 | (2023.01) |

(52) U.S. Cl.
CPC ........... *H03H 9/132* (2013.01); *H03H 3/02* (2013.01); *H03H 9/171* (2013.01); *H10N 30/06* (2023.02); *H10N 30/09* (2023.02)

(58) Field of Classification Search
CPC .......... H03H 9/132; H03H 3/02; H03H 9/171; H03H 9/02086; H03H 9/02818; H03H 9/205; H03H 9/02228; H01L 41/29; H01L 41/35
USPC ......................................................... 310/365
See application file for complete search history.

(56) References Cited

U.S. PATENT DOCUMENTS

| 3,573,673 | A | | 4/1971 | De Vries et al. | |
| 5,600,287 | A | | 2/1997 | Kwan et al. | |
| 5,864,260 | A | | 1/1999 | Lee | |
| 6,137,380 | A | * | 10/2000 | Ushiroku | H03H 9/02952 333/195 |
| 6,255,916 | B1 | * | 7/2001 | Nakamura | H03H 9/25 333/195 |
| 6,972,644 | B2 | * | 12/2005 | Nishizawa | H03H 9/6483 333/195 |
| 8,476,991 | B2 | * | 7/2013 | Goto | H03H 9/6496 333/195 |
| 9,762,202 | B2 | * | 9/2017 | Thalmayr | H03H 9/2405 |
| 9,819,329 | B2 | * | 11/2017 | Tsurunari | H03H 9/02992 |
| 2017/0313577 | A1 | | 11/2017 | Pineda et al. | |
| 2018/0358948 | A1 | * | 12/2018 | Gong | H03H 9/568 |

* cited by examiner

*Primary Examiner* — Richard Tan
(74) *Attorney, Agent, or Firm* — VIERING JENTSCHURA & PARTNER MBB

(57) ABSTRACT

According to various embodiments, there is provided a resonator device that includes a first interdigital transducer and a second interdigital transducer that is electrically connected to the first interdigital transducer. Both the first interdigital transducer and the second interdigital transducer are configured to resonate at a common frequency. At least one of an electrode width and an electrode pitch of the first interdigital transducer is different from the respective electrode width and/or electrode pitch of the second interdigital transducer such that spurious peaks of the resonator device are lower in amplitude as compared to spurious peaks of each of the first interdigital transducer and the second interdigital transducer.

20 Claims, 14 Drawing Sheets

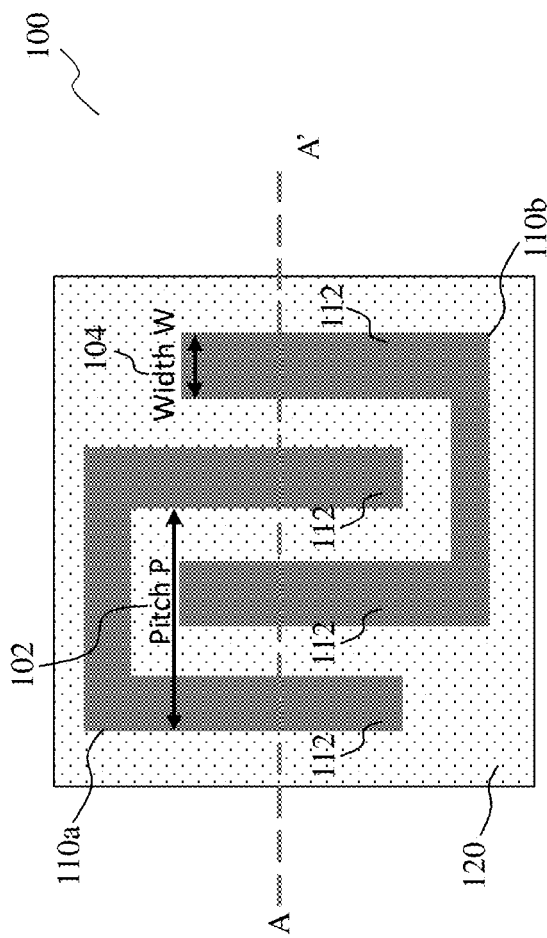
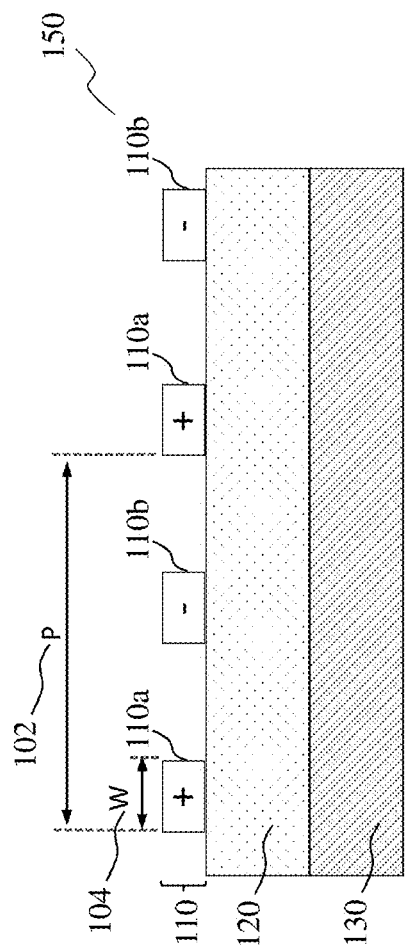
FIG. 1A
FIG. 1B

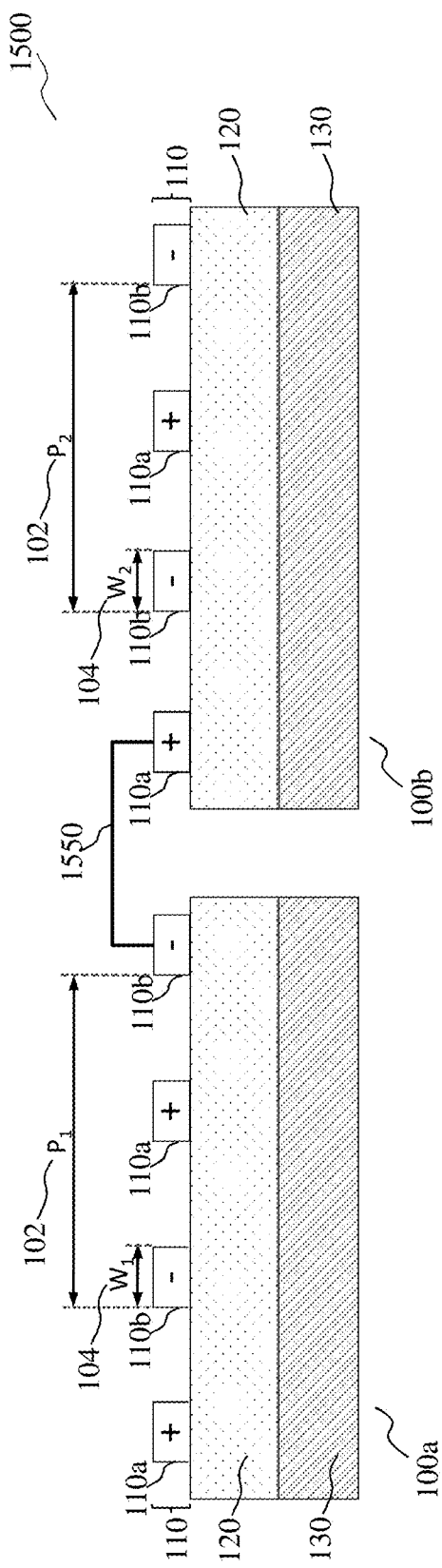
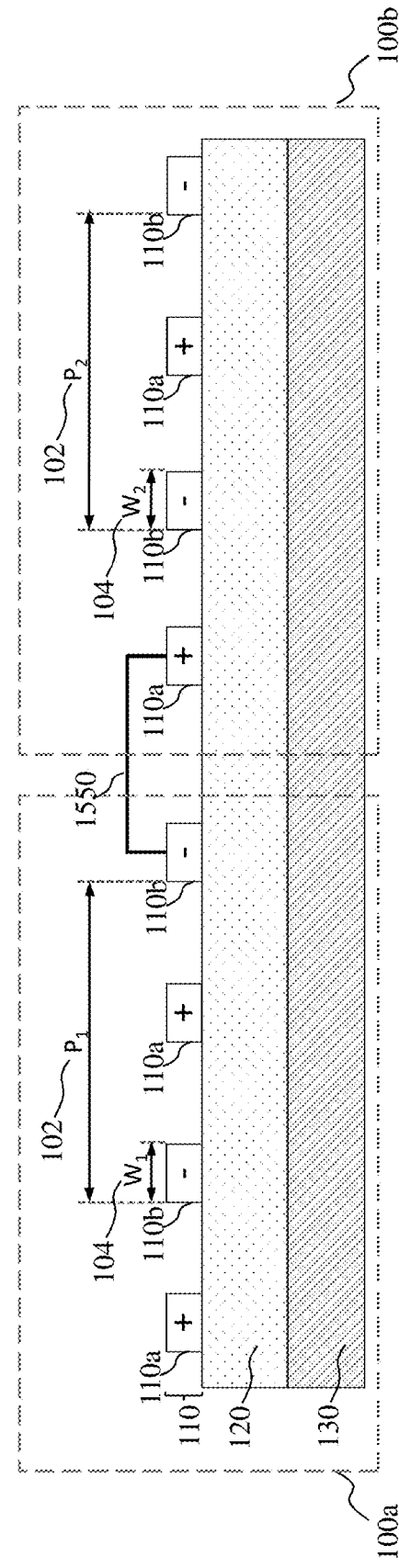
FIG. 15
FIG. 16

2100

2102 — Provide a first interdigital transducer and a second interdigital transducer, wherein both the first interdigital transducer and the second interdigital transducer have a common resonant frequency, wherein at least one of an electrode width and an electrode pitch of the first interdigital transducer is different from that of the second interdigital transducer such that spurious peaks of the resonator device are lower in amplitude as compared to the spurious peaks of each of the first interdigital transducers and the second interdigital transcducer 2104 — Electrically connect the first interdigital transducer to the second interdigital transducer

FIG. 21

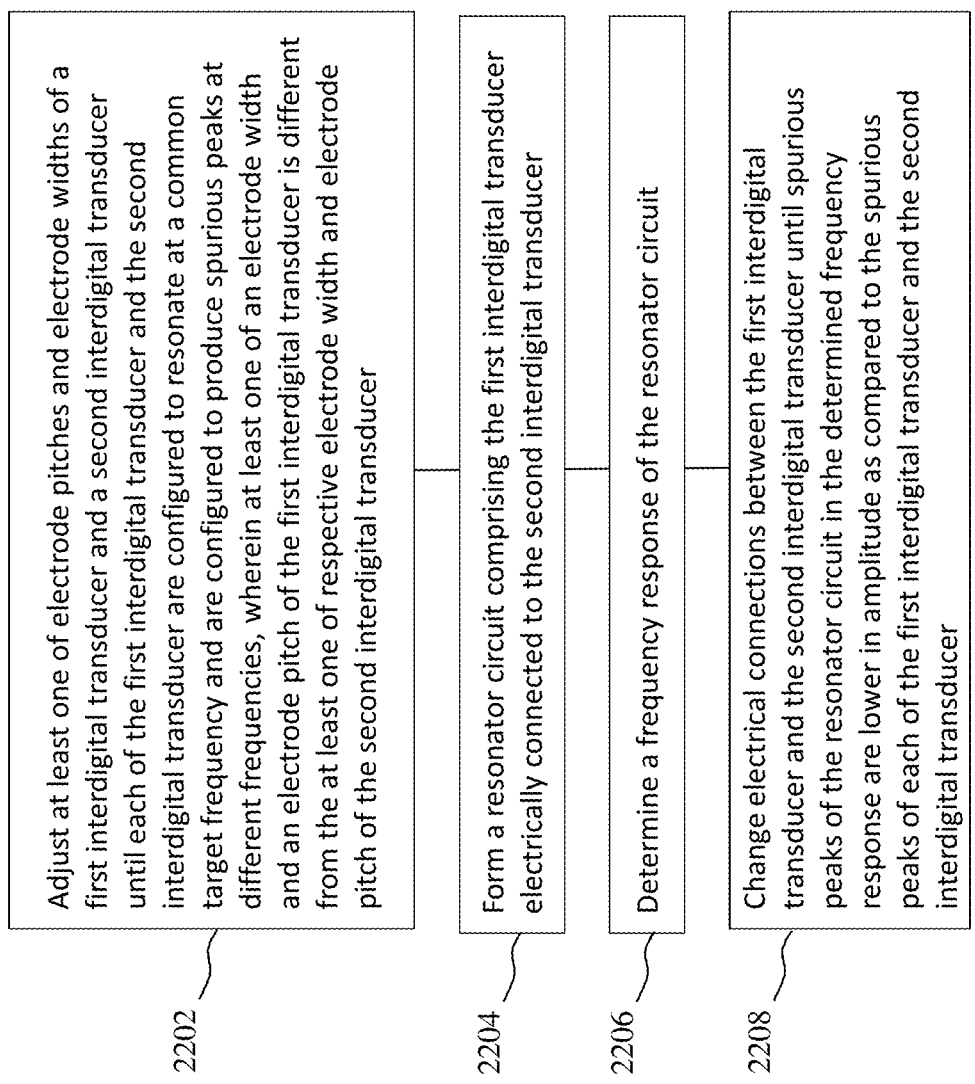

RESONATOR DEVICES AND METHODS OF FABRICATING RESONATOR DEVICES

TECHNICAL FIELD

Various embodiments relate to resonator devices and methods of fabricating resonator devices.

BACKGROUND

While an ideal resonator should produce an output that includes a signal only at the target resonant frequency, the output of real resonators typically include spurious peaks. When multiple resonators are combined in a circuit or a device, the device output may include spurious peaks that interfere with a target mode of the device.

SUMMARY

According to various embodiments, there may be provided a resonator device including: a first interdigital transducer; and a second interdigital transducer electrically connected to the first interdigital transducer. Both the first interdigital transducer and the second interdigital transducer may be configured to resonate at a common frequency. At least one of an electrode width and an electrode pitch of the first interdigital transducer may be different from the respective electrode width(s) and electrode pitch(es) of the second interdigital transducer such that spurious peaks of the resonator device may be lower in amplitude as compared to spurious peaks of each of the first interdigital transducer and the second interdigital transducer.

According to various embodiments, there may be provided a method of fabricating a resonator device. The method may include: providing a first interdigital transducer and a second interdigital transducer, wherein both the first interdigital transducer and the second interdigital transducer have a common resonant frequency; and electrically connecting the first interdigital transducer to the second interdigital transducer. At least one of an electrode width and an electrode pitch of the first interdigital transducer may be different from that of the second interdigital transducer such that spurious peaks of the resonator device may be lower in amplitude as compared to the spurious peaks of each of the first interdigital transducers and the second interdigital transducer.

According to various embodiments, there may be provided a method including: adjusting at least one of electrode pitches and electrode widths of a first interdigital transducer and a second interdigital transducer until each of the first interdigital transducer and the second interdigital transducer are configured to resonate at a common target frequency and are configured to produce spurious peaks at different frequencies; forming a resonator circuit comprising the first interdigital transducer electrically connected to the second interdigital transducer; determining a frequency response of the resonator circuit; and changing electrical connections between the first interdigital transducer and the second interdigital transducer until spurious peaks of the resonator circuit in the determined frequency response are lower in amplitude as compared to the spurious peaks of each of the first interdigital transducer and the second interdigital transducer. At least one of an electrode width and an electrode pitch of the first interdigital transducer may be different from the at least one of respective electrode width and electrode pitch of the second interdigital transducer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which:

FIG. 1A illustrates a top view of an interdigital transducer (IDT) according to various non-limiting embodiments.

FIG. 1B illustrates a cross-sectional view of the IDT of FIG. 1A.

FIG. 15 illustrates a cross-sectional view of a resonator device according to various non-limiting embodiments.

FIG. 16 illustrates a cross-sectional view of a resonator device according to various non-limiting embodiments.

FIG. 21 illustrates a flow diagram of a method for fabricating a resonator device according to various non-limiting embodiments.

FIG. 22 illustrates a flow diagram of a method according to various non-limiting embodiments.

DESCRIPTION

Figure 2A:
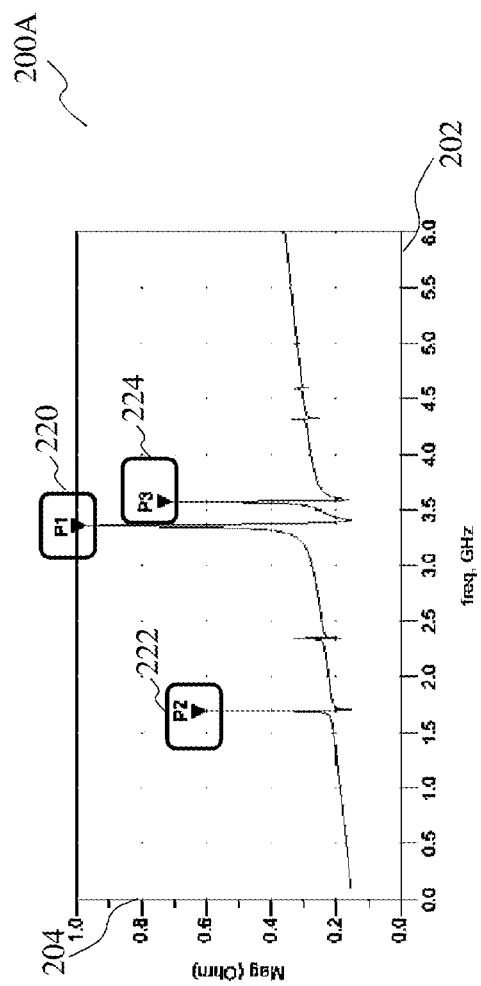
FIG. 2A illustrates a graph showing the frequency response of a resonator.

Embodiments described below in context of the devices are analogously valid for the respective methods, and vice versa. Furthermore, it will be understood that the embodiments described below may be combined, for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

The term "coupled" (or "connected") herein may be understood as electrically coupled or as mechanically coupled, for example attached or fixed, or just in contact without any fixation, and it will be understood that both direct coupling or indirect coupling (in other words: coupling without direct contact) may be provided.

In order that the invention may be readily understood and put into practical effect, various embodiments will now be described by way of examples and not limitations, and with reference to the figures.

In the context of various embodiments, the phrase "resonator device" may be but is not limited to being interchangeably referred to as a "resonator circuit".

According to various non-limiting embodiments, a resonator circuit may include a plurality of acoustic resonators with interdigital transducers (IDT) connected in series or in shunt. These acoustic resonators may have the same frequency for their target modes but may have different frequencies for their respective unwanted modes. The IDTs of these acoustic resonators may have, in general, different pitches and/or widths to decouple unwanted modes, while maintaining the same frequency for their target modes. The resonator circuit may achieve improved inter-device mode decoupling without requiring external decoupling components. The resonator circuit may be fabricated monolithically on a single chip.

FIG. 1A illustrates a top view of an interdigital transducer (IDT) 100 according to various non-limiting embodiments. The IDT 100 may be a type of resonator. The IDT 100 may convert electrical signals to vibrations, and may also convert vibrations to electrical signals. The IDT 100 may vibrate to generate acoustic waves. The IDT 100 may include a pair of interlocking comb-shaped array of electrodes 110a and 110b. While FIG. 1 shows the electrodes 110a and 110b as each having two fingers 112, it should be understood that the electrodes 110a and 110b may each have any quantity of fingers 112 as long as there are at least two fingers each for the electrodes 110a and 110b. Electrodes 110 and 110b may be at least substantially identical in a non-limiting embodiment. Key design parameters of the IDT 100 may include the pitch 102 (denoted herein as P) and the width 104 (denoted herein as W). The pitch 102 may be defined as the distance between two adjacent fingers 112 of the same electrode 110a or 110b, measured from the centers of the adjacent fingers 112. The pitch 102 may determine a resonant wavelength of the IDT 100. The width 104 may be defined as the width of the fingers 112. The width 104 may be measured in a direction at least substantially parallel to the displacement between adjacent fingers 112.

FIG. 1B illustrates a cross-sectional view 150 of the IDT 100, as cut across the line AA' shown in FIG. 1A. The IDT 100 may be formed on the base structure of a thin-film piezoelectric acoustic resonator. The IDT 100 may include a top electrode 110, a piezoelectric layer 120 and a bottom electrode 130. The top electrode 110 may include the interlocking, in other words, interdigitated, electrodes 110a and 110b. The piezoelectric layer 120 may be arranged between the top electrode 110 and the bottom electrode 130. The top electrode 110 may be connected to an alternating electrical signal, for example, an alternating current (AC) signal such that the electrode 110a and the electrode 110b may have opposing polarities at any one time. Consequently, the electric field between two adjacent fingers 112 may alternate, causing alternating regions of tensile and compressive strain in the piezoelectric layer 120 to generate acoustic waves. The bottom electrode 130 may be connected to ground, or a constant voltage (direct current).

FIG. 2A illustrates a graph 200A showing the frequency response of a resonator. The graph 200A has a horizontal axis 202 and a vertical axis 204. The vertical axis 204 indicates the magnitude of the output electrical signal in Ohms. The horizontal axis 202 indicates frequency in Gigahertz (GHz). The graph 200A shows a first peak 220 occurring at about 3.3 GHz which is the target mode noted as P1; a second peak 222 occurring at about 1.7 GHz, and a third peak 224 occurring at about 3.6 GHz. The second peak 222 and the third peak 224 are unwanted modes noted as P2 and P3 respectively.

Figure 2B:
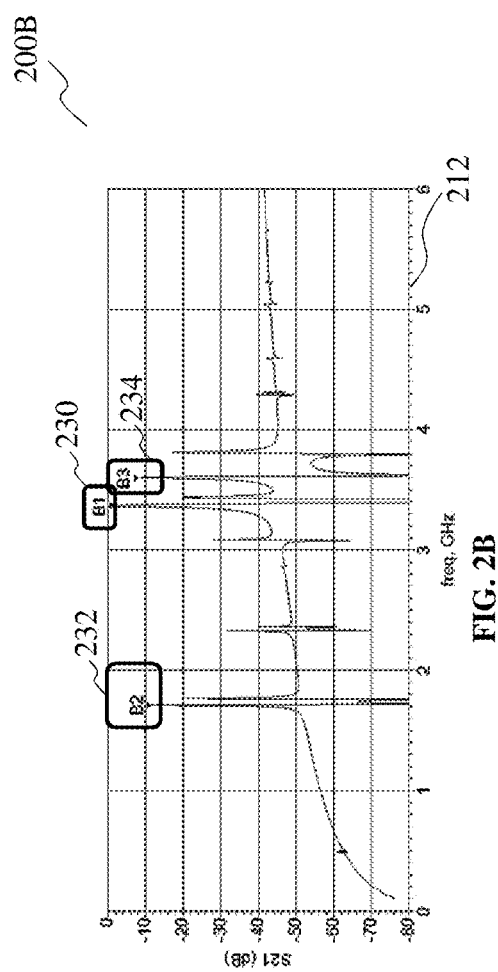
FIG. 2B illustrates a graph showing the frequency response of a resonator ladder circuit.

FIG. 2B illustrates a graph 200B showing the frequency response of a resonator ladder circuit. The graph 200B has a horizontal axis 212 and a vertical axis 214. The vertical axis 214 indicates the signal power transferred from the input port to the output port of the resonator ladder circuit in decibels (dB). The horizontal axis 212 indicates frequency in GHz. The graph 200B shows a first peak 230 occurring at about 3.3 GHz which corresponds to the target passband B1; a second peak 232 occurring at about 1.7 GHz which is an unwanted passband B2, and a third peak 224 occurring at about 3.6 GHz which is an unwanted passband B3. The unwanted passband B2 corresponds to the unwanted mode P2, while the unwanted passband B3 corresponds to the unwanted mode P3. In other words, the unwanted modes P2 and P3 may create the unwanted passbands B2 and B3. The unwanted passbands B2 and B3 may remain in the frequency spectrum of the resonator ladder circuit as they may not meet the out-of-band rejection requirement of the resonator ladder circuit. Subsequent paragraphs will describe resonator devices that may attenuate these unwanted passbands, in comparison with conventional resonator devices.

Figure 3:
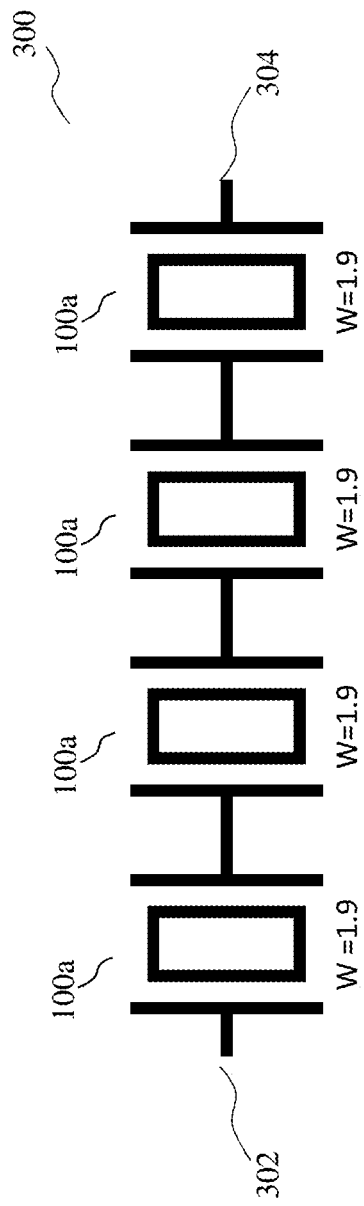
FIG. 3 illustrates a schematic view of a conventional resonator device.

FIG. 3 illustrates a schematic view of a conventional resonator device 300. The resonator device 300 may consist of a plurality of IDTs 100a connected in series. Each IDT 100a may have the same width, for example W=1.9 um. Each IDT 100a may also have the same pitch. The resonator device 300 may receive an input signal at an input port 302, and generate an output signal based on the input signal at an output port 304.

Figure 4:
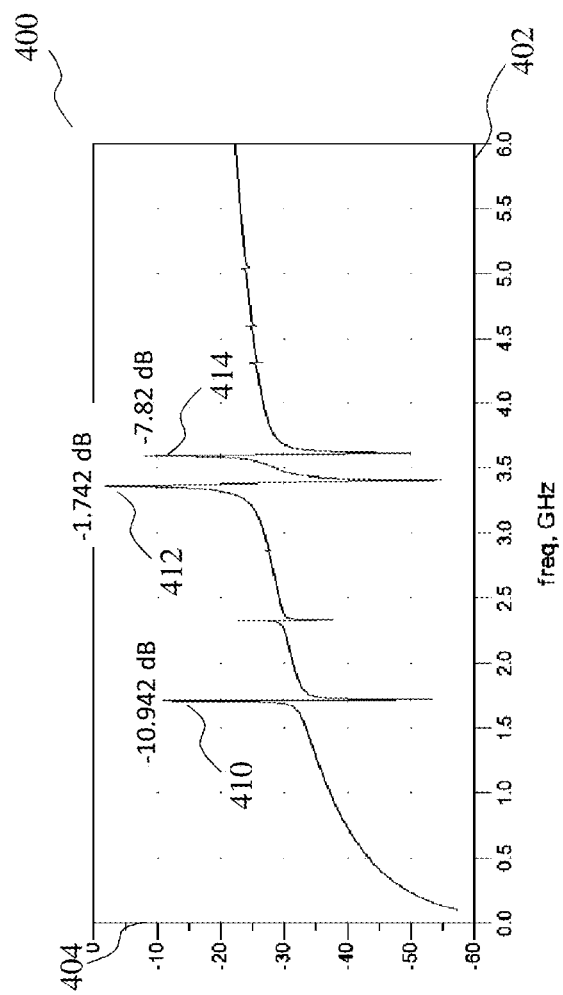
FIG. 4 illustrates a graph showing the frequency response of the resonator device of FIG. 3.

FIG. 4 illustrates a graph 400 showing the frequency response of the resonator device 300. The graph 400 has a horizontal axis 402 and a vertical axis 404. The vertical axis 404 indicates the signal power transferred from the input port 302 to the output port 340 in dB. The horizontal axis 402 indicates the operating frequency of the resonator device 300 in GHz. The graph 400 shows a first peak 412 occurring at about 3.3 GHz, a second peak 410 occurring at about 1.7 GHz, and a third peak 414 occurring at about 3.6 GHz. The peaks correspond to the modes discussed with respect to FIG. 2A. The first peak 412 corresponds to the target mode P1; the second peak 410 corresponds to the unwanted mode P2, and the third peak 414 corresponds to the unwanted mode P3. In other words, the second peak 410 and the third peak 414 are spurious peaks. The first peak 412 has the largest value of −1.742 dB; whereas, the second peak 410 has a value of −10.942 dB and the third peak 414 has a value of −7.82 dB.

Figure 5:
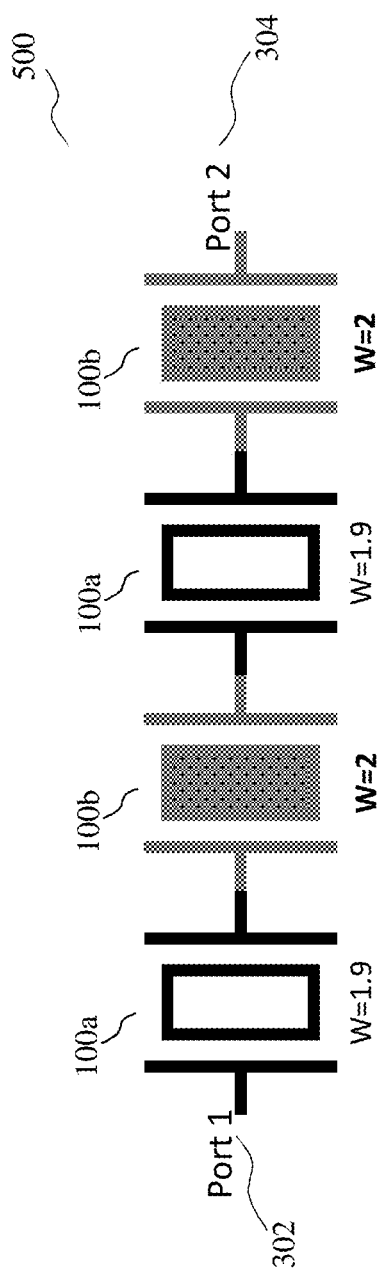
FIG. 5 illustrates a schematic view of a resonator device according to various non-limiting embodiments.

FIG. 5 illustrates a schematic view of a resonator device 500 according to various non-limiting embodiments. The resonator device 500 may differ from the conventional resonator device 300, in that the plurality of IDTs that are connected in series may include IDTs 100a with a first width, and IDTs 100b with a second width. The IDTs 100a and 100b may be at least substantially similar, except that they have different widths. The IDTs 100a and 100b may have at least substantially the same pitch, such that their resonant frequencies are at least substantially equal in a non-limiting embodiment. As an example, the first width may be 1.9 um, while the second width may be 2.0 um. The IDTs 100a and the IDTs 100b may be arranged alternately, such that each IDT 100a is immediately adjacent, in other words, directly connected, to an IDT 100b.

Figure 6:
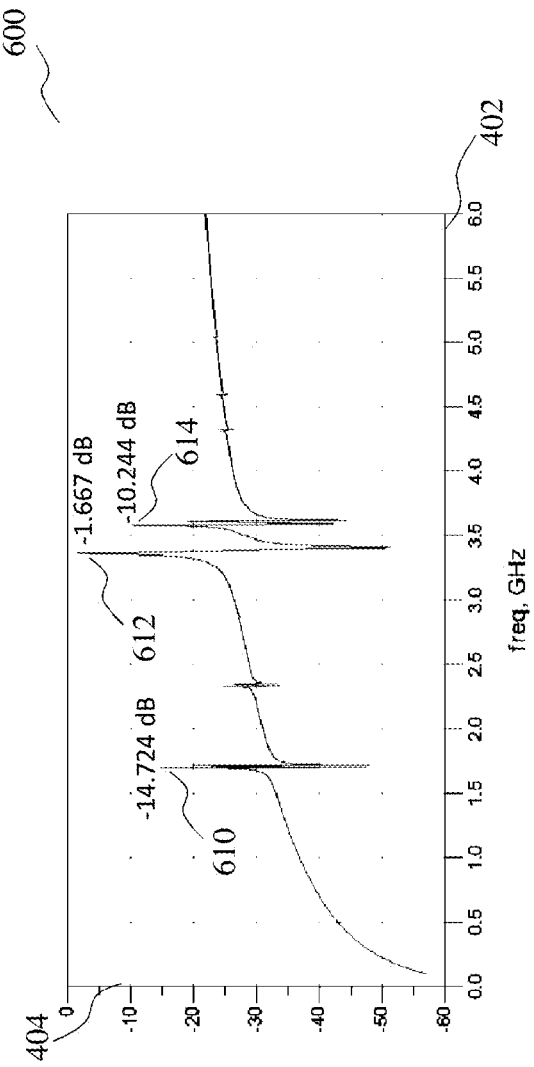
FIG. 6 illustrates a graph showing the frequency response of the resonator device of FIG. 5.

FIG. 6 illustrates a graph 600 showing the frequency response of the resonator device 500. The graph 600 shows a first peak 612 having a value of −1.667 dB at about 3.3 GHz, a second peak 610 having a value of −14.724 dB occurring at about 1.7 GHz, and a third peak 614 having a value of −10.244 dB occurring at about 3.6 GHz. The first peak 612 corresponds to the target mode P1; the second peak 610 corresponds to the unwanted mode P2, and the third peak 614 corresponds to the unwanted mode P3. As compared to the frequency response of the conventional resonator device 300, in the frequency response of the resonator device 500, the unwanted modes P2 and P3 are attenuated. The unwanted mode P2 is attenuated by about 3.78 dB while the unwanted mode P3 is attenuated by about 2.42 dB. The target mode P1 is unaffected, or even amplified by about 0.075 dB.

Figure 7:
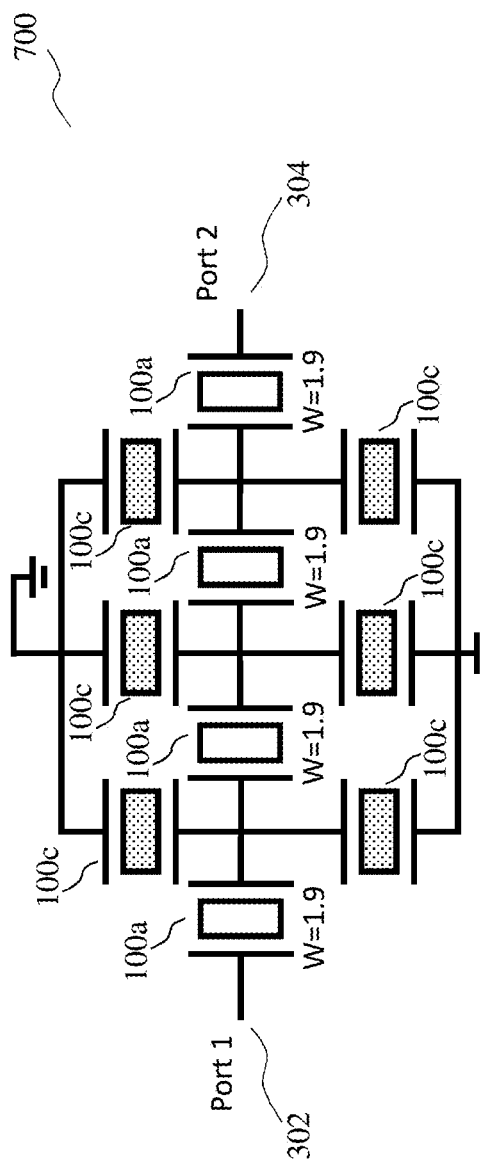
FIG. 7 illustrates a schematic view of a conventional resonator device.

FIG. 7 illustrates a schematic view of a conventional resonator device 700. The resonator device 700 may include a ladder filter circuit. The ladder filter circuit may include a first plurality of IDTs 100a connected in series like in the resonator device 300, and a second plurality of IDTs 100b connected to the first plurality of IDTs 100a in shunt, in other words, in parallel. The first plurality of IDTs may be referred herein as "series resonators", while the second plurality of IDTs may be referred herein as "shunt resonators". All of the IDTs 100a may have the same width, for example a first width, W=1.9 um. All of the IDTs 100a may also have the same pitch. All of the IDTs 100c may have the same width, which may be the same or may be different, from the first width. All of the IDTs 100c may also have the same pitch, which may be the same or may be different, from the pitch of the IDTs 100a. The resonator device 700 may receive an input signal at an input port 302, and generate an output signal based on the input signal at an output port 304.

Figure 8:
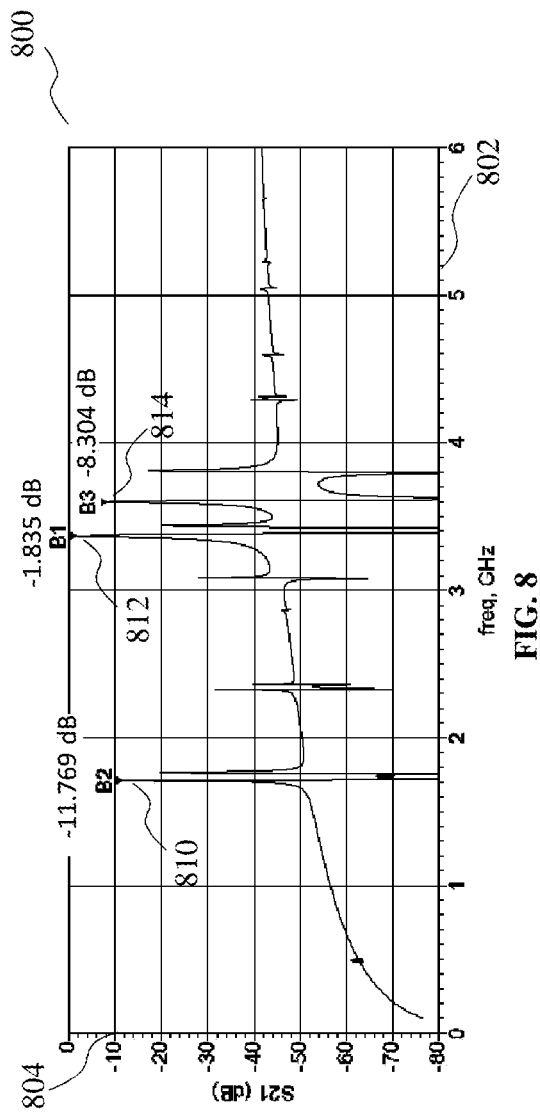
FIG. 8 illustrates a graph showing the frequency response of the resonator device of FIG. 7.

FIG. 8 illustrates a graph 800 showing the frequency response of the resonator device 700. The graph 800 has a horizontal axis 802 and a vertical axis 804. The vertical axis 804 indicates the signal power transferred from the input port 302 to the output port 340 in dB. The horizontal axis 802 indicates the operating frequency of the resonator device 700 in GHz. The graph 800 shows a first peak 812 occurring at about 3.3 GHz, a second peak 810 occurring at about 1.7 GHz, and a third peak 814 occurring at about 3.6 GHz. The peaks correspond to the passbands discussed with respect to FIG. 2B. The first peak 812 corresponds to the target band B1; the second peak 810 corresponds to the unwanted passband B2, and the third peak 814 corresponds to the unwanted passband B3. The first peak 812 has the largest value of −1.835 dB, whereas the second peak 810 has a value of −11.769 dB and the third peak 814 has a value of −8.304 dB.

Figure 9:
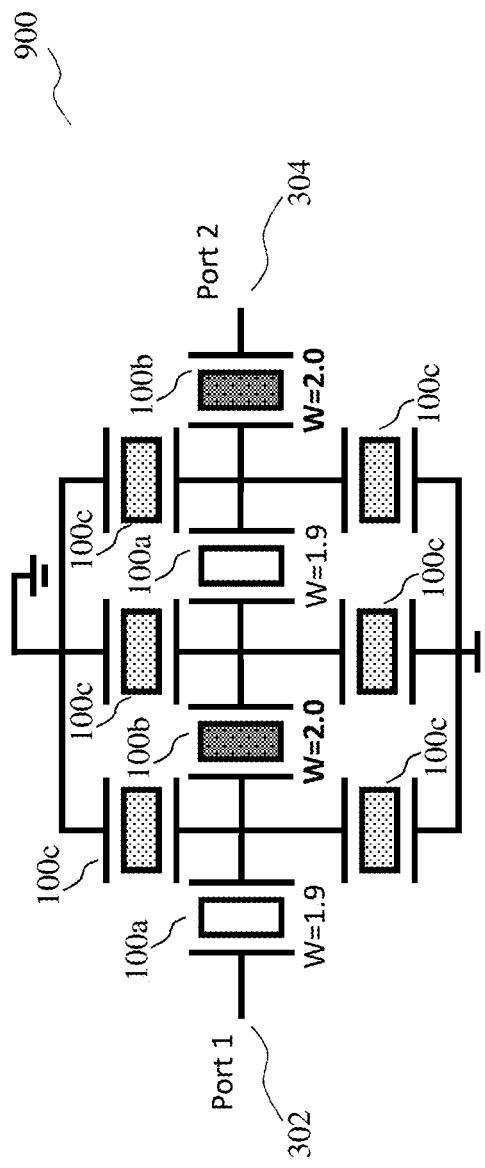
FIG. 9 illustrates a schematic view of a resonator device according to various non-limiting embodiments.

FIG. 9 illustrates a schematic view of a resonator device 900 according to various non-limiting embodiments. Like the resonator device 700, the resonator device 900 may include a first plurality of IDTs connected in series and a second plurality of IDTs 100c connected in shunt to the first plurality of IDTs. The resonator device 900 may differ from the conventional resonator device 700, in that the first plurality of IDTs may include IDTs 100a with a first width, and IDTs 100b with a second width, like in the resonator device 500. The IDTs 100a and 100b may have at least substantially identical pitch in a non-limiting embodiment. All of the IDTs 100c may have the same width, which may be the same or may be different, from the first width or the second width. The resonator device 900 may receive an input signal at an input port 302, and generate an output signal based on the input signal at an output port 304. The resonant frequency of the shunt resonators, i.e. the second plurality of IDTs, may be lower than the resonant frequency of the series resonators, i.e. the first plurality of IDTs.

Figure 10:
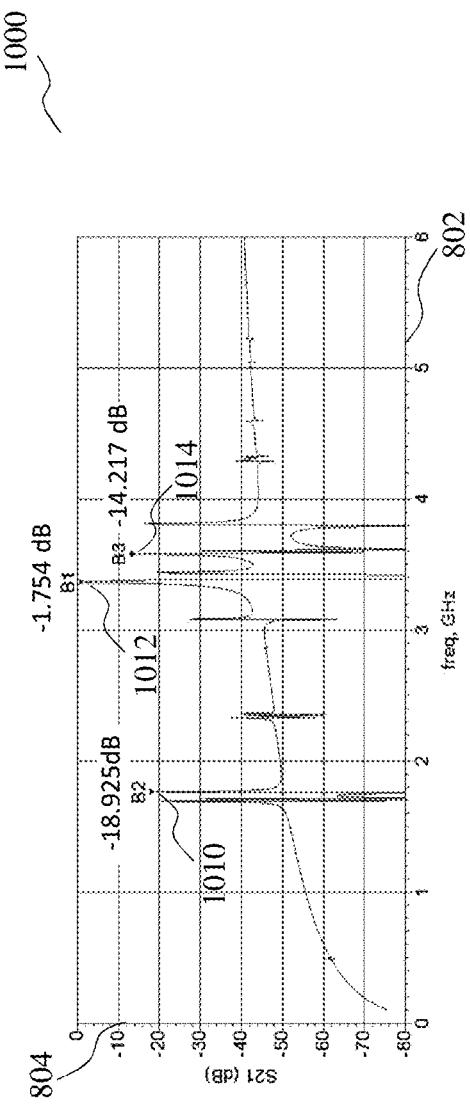
FIG. 10 illustrates a graph showing the frequency response of the resonator device of FIG. 9.

FIG. 10 illustrates a graph 1000 showing the frequency response of the resonator device 900. The graph 1000 shows a first peak 1012 corresponding to the target passband B1 as having a value of −1.754 dB at about 3.3 GHz, a second peak 1010 corresponding to the unwanted passband B2 as having a value of −18.925 dB occurring at about 1.7 GHz, and a third peak 1014 corresponding to the unwanted passband B3 as having a value of −14.217 dB occurring at about 3.6 GHz. As compared to the frequency response of the conventional resonator device 700, in the frequency response of the resonator device 900, the unwanted passbands B2 and B3 are attenuated. The unwanted passband B2 is attenuated by more than 7 dB while the unwanted passband B3 is attenuated by about 6 dB. The target passband B1 is unaffected, or even amplified by about 0.08 dB.

Figure 11:
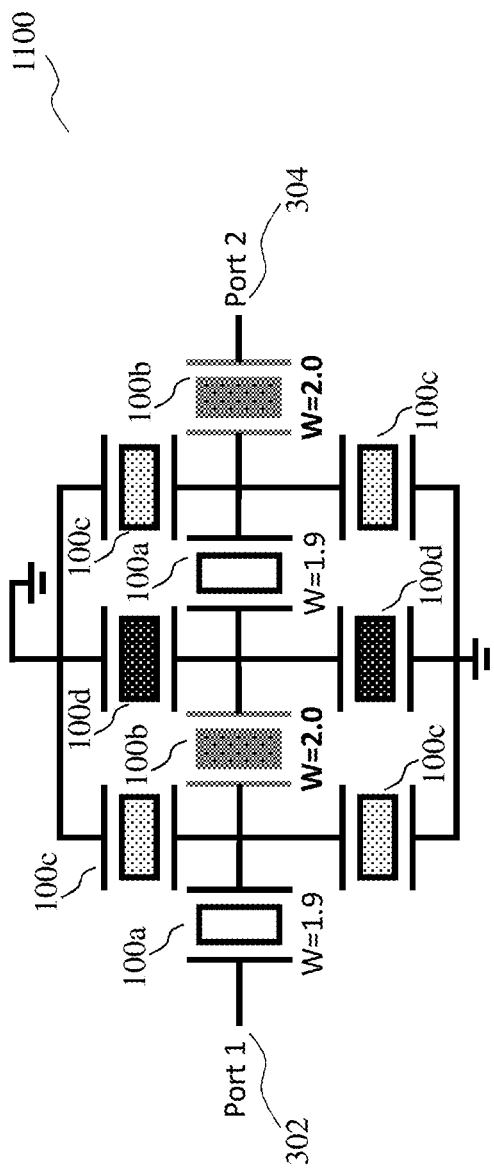
FIG. 11 illustrates a schematic view of a resonator device according to various non-limiting embodiments.

FIG. 11 illustrates a schematic view of a resonator device 1100 according to various non-limiting embodiments. Like the resonator device 900, the resonator device 1100 may include a first plurality of IDTs connected in series and a second plurality of IDTs connected in shunt to the first plurality of IDTs, and the first plurality of IDTs may include IDTs of different widths. The resonator device 1100 may differ from the resonator device 900, in that the second plurality of IDTs may include IDTs 100c with a first pitch, and IDTs 100d with a second pitch. For example, the first pitch may be 4.8 um while the second pitch may be 4.74 um. The IDTs 100c and 100d may have at least substantially the same width in a non-limiting embodiment. The width of the IDTs 100c and 100d may be different from the widths of the first plurality of IDTs 100a and 100b. The width of the second plurality of IDTs 100c and 100d may be less than the widths of the first plurality of IDTs 100a and 100b. For example, the width of the second plurality of IDTs 100c and 100d may be 1.5 um. The IDTs 100c and the IDTs 100d may be arranged alternately such that each IDT of the first plurality of IDTs may be directly connected to both IDT 100c and IDT 100d.

Figure 12:
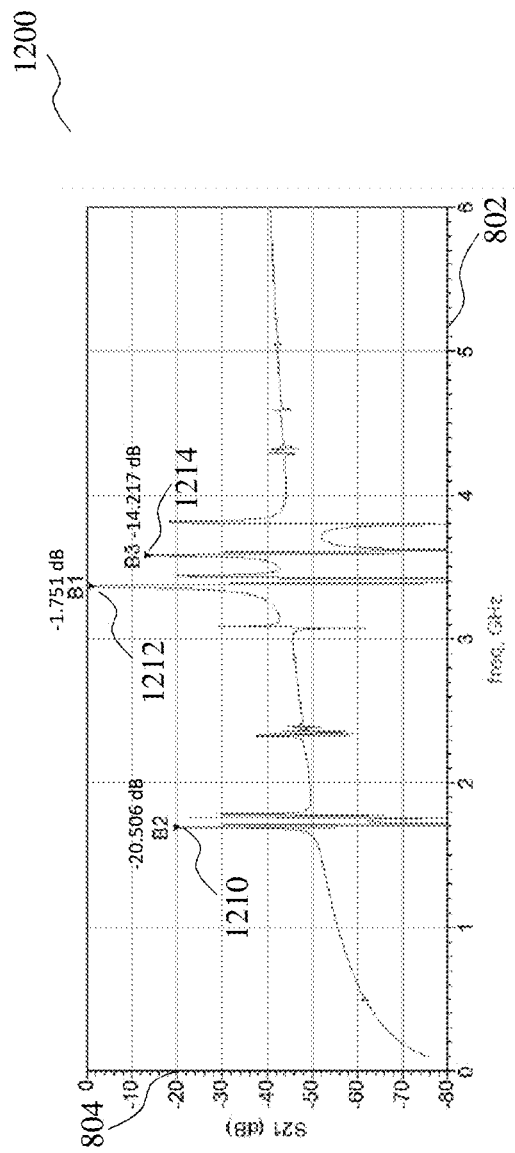
FIG. 12 illustrates a graph showing the frequency response of the resonator device of FIG. 11.

FIG. 12 illustrates a graph 1200 showing the frequency response of the resonator device 1100. The graph 1200 shows a first peak 1212 corresponding to the target passband B1 as having a value of −1.751 dB at about 3.3 GHz, a second peak 1210 corresponding to the unwanted passband B2 as having a value of −20.506 dB occurring at about 1.7 GHz, and a third peak 1214 corresponding to the unwanted passband B3 as having a value of −14.217 dB occurring at about 3.6 GHz. Like the resonator device 900, the resonator device 1100 may attenuate the unwanted passbands B2 and B3 without attenuating the target passband B1. As compared to the frequency response of the resonator device 900, in the frequency response of the resonator device 1100, the unwanted passband B2 is further attenuated by 1.58 dB while the target passband B1 and the unwanted passband B3 are unaffected. This shows that the unwanted passbands may be further attenuated by having a mix of shunt resonators of different pitches.

Figure 13:
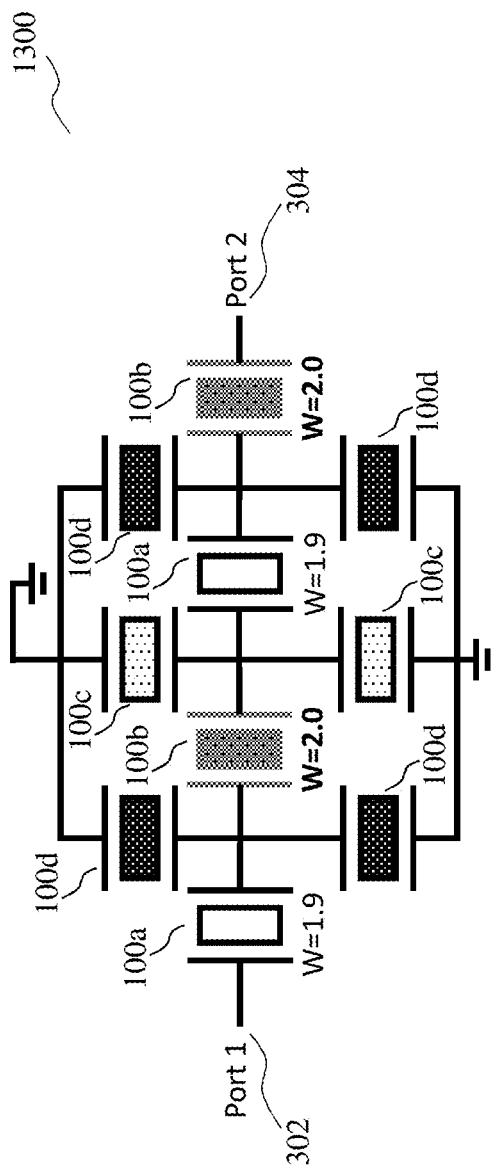
FIG. 13 illustrates a schematic view of a resonator device according to various non-limiting embodiments.

FIG. 13 illustrates a schematic view of a resonator device 1300 according to various non-limiting embodiments. The resonator device 1300 may be similar to the resonator device 1100, except that the arrangement of the second plurality of IDTs 100c and 100d are reversed. The quantity of IDTs 100c and 100d may also differ from that in the resonator device 1100.

Figure 14:
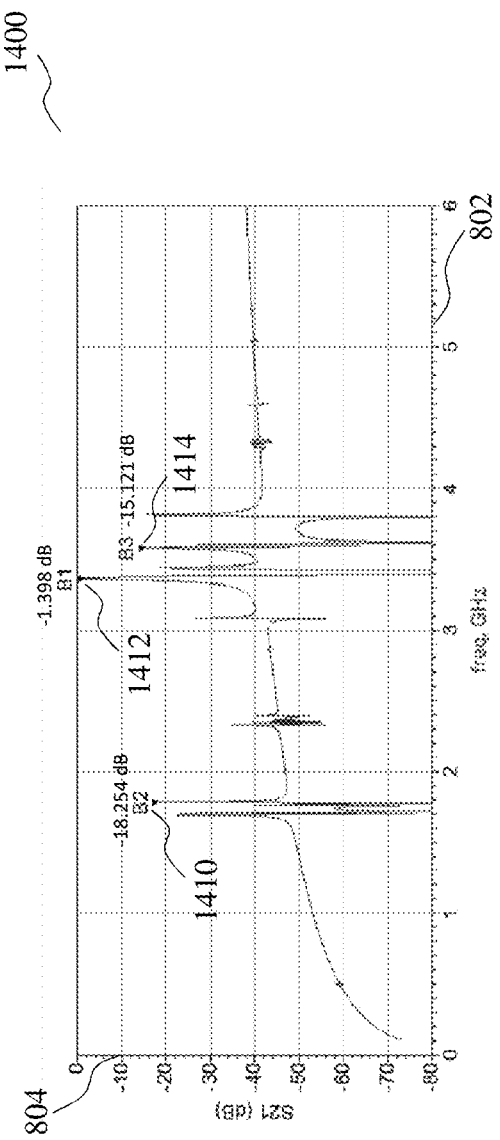
FIG. 14 illustrates a graph showing the frequency response of the resonator device of FIG. 13.

FIG. 14 illustrates a graph 1400 showing the frequency response of the resonator device 1300. The graph 1400 shows a first peak 1412 corresponding to the target passband B1 as having a value of −1.398 dB at about 3.3 GHz, a second peak 1410 corresponding to the unwanted passband B2 as having a value of −18.254 dB occurring at about 1.7 GHz, and a third peak 1414 corresponding to the unwanted passband B3 as having a value of −15.121 dB occurring at about 3.6 GHz. Like the resonator device 900, the resonator device 1300 may attenuate the unwanted passbands B2 and B3 without attenuating the target passband B1. As compared to the frequency response of the resonator device 1100, in the frequency response of the resonator device 1300, the unwanted passband B2 is amplified by about 2.25 dB, the unwanted passband B3 is further attenuated by about 0.90 dB while the target passband B1 is amplified by about 0.35 dB. This shows that the arrangement of the shunt resonators may also affect the attenuation of the unwanted passbands.

FIG. 15 illustrates a cross-sectional view of a resonator device 1500 according to various non-limiting embodiments. The resonator device 1500 may include a first IDT 100a and a second IDT 100b. Each of the first IDT 100a and the second IDT 100b may be at least substantially identical, or at least similar in their physical composition. Each of the first IDT 100a and the second IDT 100b may include a top electrode 110, a piezoelectric layer 120 and a bottom electrode 130, like described for the IDT 100 with respect to FIG. 1B. The first IDT 100a and the second IDT 100b may each be configured to resonate at the same frequency. The first IDT 100a and the second IDT 100b may have different widths 104, i.e. $W_1 \neq W_2$. The first IDT 100a and the second IDT 100b may have the same pitch in a non-limiting embodiment. Alternatively, the first IDT 100a and the second IDT 100b may have different pitches 102, i.e. $P_1 \neq P_2$, but their resonant frequencies may still be at least substantially the same, by having different physical compositions. For example, the thickness(es) of at least one of the top electrode 110, the piezoelectric layer 120, and the bottom electrode 130 of the first IDT 100a may be different from that of the second IDT 100b. The first IDT 100a may be connected to the second IDT 100b, by at least one of electrical and acoustic connection 1550. The electrical connection may be an electrically conductive material, which may be formed out of the same material as the top electrode 110, for example, during the process of patterning the interlocking electrodes 110a and 110b. The acoustic connection may arise out of the first IDT 100a and the second IDT 100b being in close proximity, for example, being arranged on the same wafer, such that vibrations of the two IDTs may couple together.

FIG. 16 illustrates a cross-sectional view of a resonator device 1600 according to various non-limiting embodiments. The resonator device 1600 may be similar to the resonator device 1500, except that the first IDT 100a and the second IDT 100b may be conjoined at at least one of the piezoelectric layer 120 and the bottom electrode layer 130. The electrical connection may be created, in the same process of creating the top electrode 110. The top electrode 110 may be created by depositing an electrically conductive material such as a metal, over the piezoelectric layer 120, and etching the electrically conductive material to form the interlocking electrodes 110a and 110b. The electrical connection may be formed in the same process of forming the interlocking electrodes 110a and 110b. The acoustic connection may arise out of the first IDT 100a and the second IDT 100b sharing the same piezoelectric layer 120 which vibrates in response to electrical signals.

According to various non-limiting embodiments, the resonator devices may operate in any one of Surface Acoustic Wave (SAW), Lamb or other lateral wave modes.

According to various non-limiting embodiments, the resonator devices may include, or may be part of, a filter, a transducer or other frequency-selective devices.

According to various non-limiting embodiments, a plurality of the resonator devices may be provided on a single wafer. Each resonator device may function as a filter, and the plurality of resonator devices may be connected to form a filter bank or a multiplexer. Each filter may be decoupled to the other filters in the bank by having its IDT pitch and width designed to reject the unwanted modes.

Figure 17:
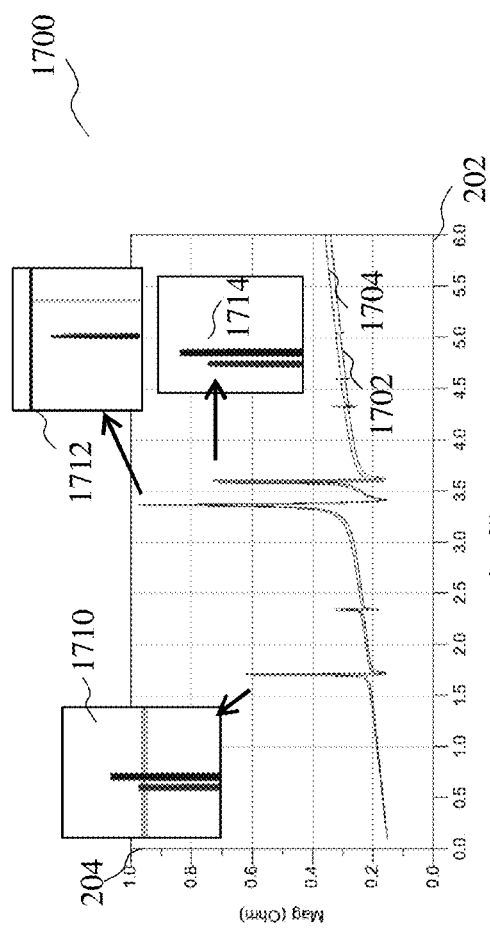
FIG. 17 illustrates a graph showing the frequency responses of two IDTs that have different widths.

FIG. 17 illustrates a graph 1700 showing the frequency responses of two IDTs 100 that have different widths. The graph 1700 has a horizontal axis 202 and a vertical axis 204. The graph 1700 includes a first plot 1702 and a second plot 1704. The first plot 1702 is the frequency response of a first IDT having a pitch of 4.8 um and a width of 1.9 um. The second plot 1704 is the frequency response of a second IDT having a pitch of 4.8 um and a width of 2.0 um. The magnified diagram 1712 shows that the target modes of the first plot 1702 and the second plot 1704 coincide at around 3.3 GHz, corresponding to the target mode P1. The magnified diagrams 1710 and 1712 show that the unwanted modes P2 and P3 of the first plot 1702 and the second plot 1704 differ. In other words, the spurious peaks of IDTs 100 may be sensitive to the width of the IDTs. Therefore, the resonator devices described in the earlier paragraphs may be able to decouple the unwanted acoustic modes by having a mixture of IDTs that have different widths connected in series.

Figure 18:
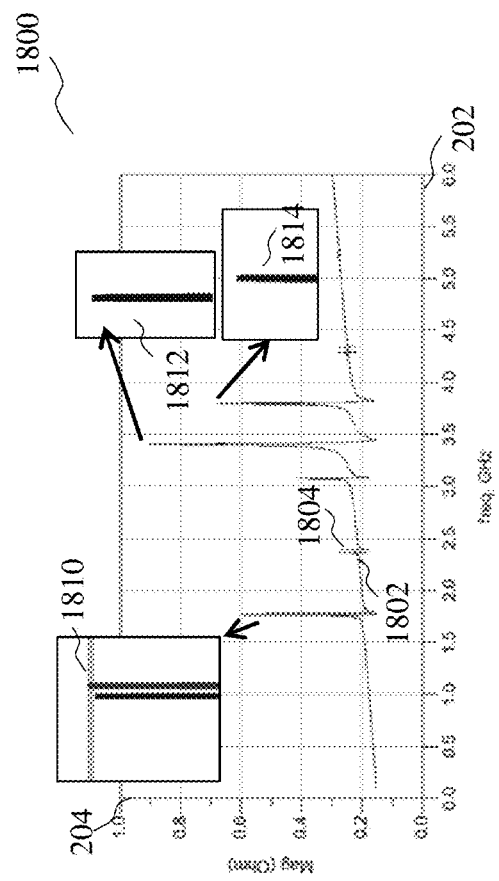
FIG. 18 illustrates a graph showing the frequency responses of two IDTs that have different pitches.

FIG. 18 illustrates a graph 1800 showing the frequency responses of two IDTs 100 that have different pitches. The graph 1800 includes a first plot 1802 and a second plot 1804. The first plot 1802 is the frequency response of a first IDT having a pitch of 4.8 um and a width of 1.5 um. The second plot 1804 is the frequency response of a second IDT having a pitch of 4.74 um and a width of 1.5 um. The magnified diagram 1812 shows that the target modes of the first plot 1802 and the second plot 1804 coincide at around 3.3 GHz, corresponding to the target mode P1, and are about the same in amplitude. The magnified diagrams 1810 and 1812 show that the unwanted modes P2 and P3 of the first plot 1802 and the second plot 1804 differ. In other words, the spurious peaks of IDTs 100 may be sensitive to the pitch of the IDTs. Therefore, the resonator devices described in the earlier paragraphs may be able to decouple the unwanted acoustic modes, by having a mixture of IDTs that have different pitches connected in parallel.

According to various non-limiting embodiments, the resonator devices may decouple unwanted acoustic modes, by having a mixture of IDTs that have different pitches and different widths. These IDTs may be connected in series and/or in parallel.

Figure 19:
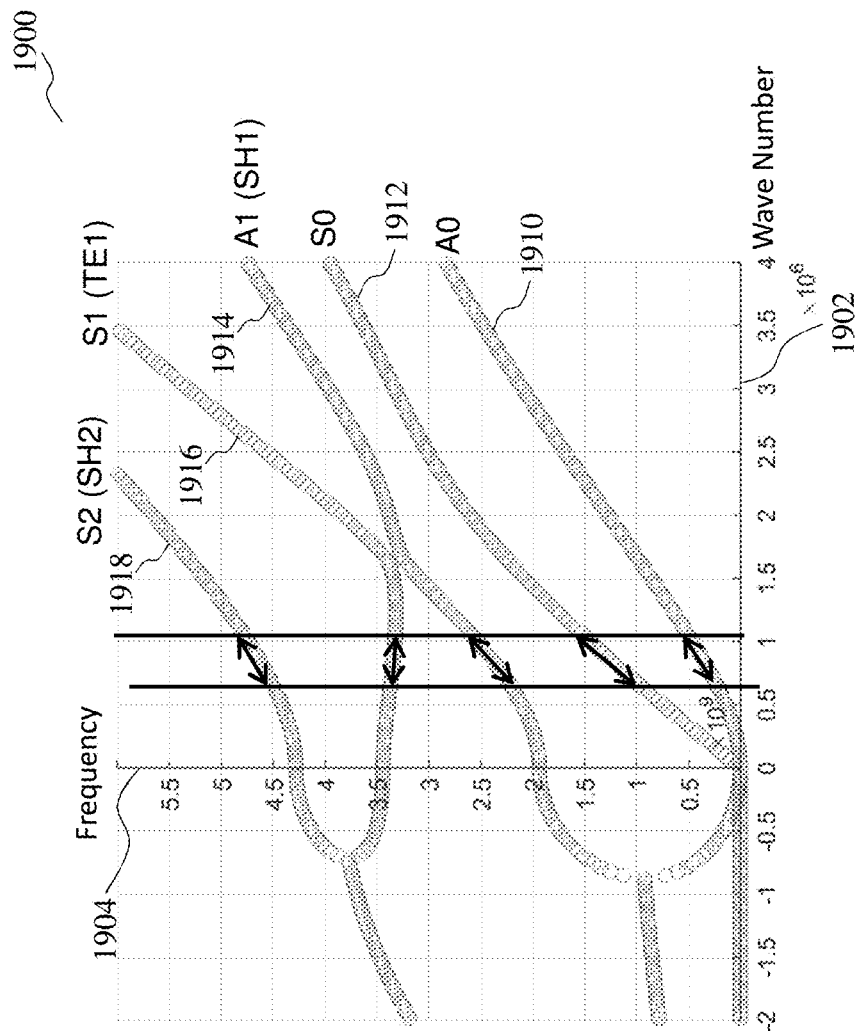
FIG. 19 illustrates a graph that shows the dispersion diagram for various vibration modes in an IDT.

FIG. 19 illustrates a graph 1900 that shows the dispersion diagram for various vibration modes in an IDT 100. The graph 1900 has a horizontal axis 1902 and a vertical axis 1904. The vertical axis 1904 indicates frequency in Megahertz (MHz). The horizontal axis 1902 indicates wave number in meters. Plot 1910 represents a fundamental mode vibration which is an antisymmetric wave, denoted as A0. Plot 1912 represents a fundamental mode vibration which is a symmetric wave, denoted as S0. Plot 1914 represents a first mode vibration which is an antisymmetric shear horizontal wave, denoted as A1(SH1). Plot 1916 represents a first mode vibration which is a transverse wave, denoted as S1(TE1). Plot 1918 represents a second mode vibration which is a shear horizontal wave, denoted as S2(SH2). The graph 1900 shows how the frequency of each wave varies according to changes in the wave number. Multiple modes may be supported for each given wavelength/wave as represented by the pitch/width of the IDT 100. The graph 1900 shows that some of the modes are less sensitive to wave number changes. For example, the frequency of S1(TE1) is less sensitive to wave number change as compared to the frequency of S0.

Figure 20:
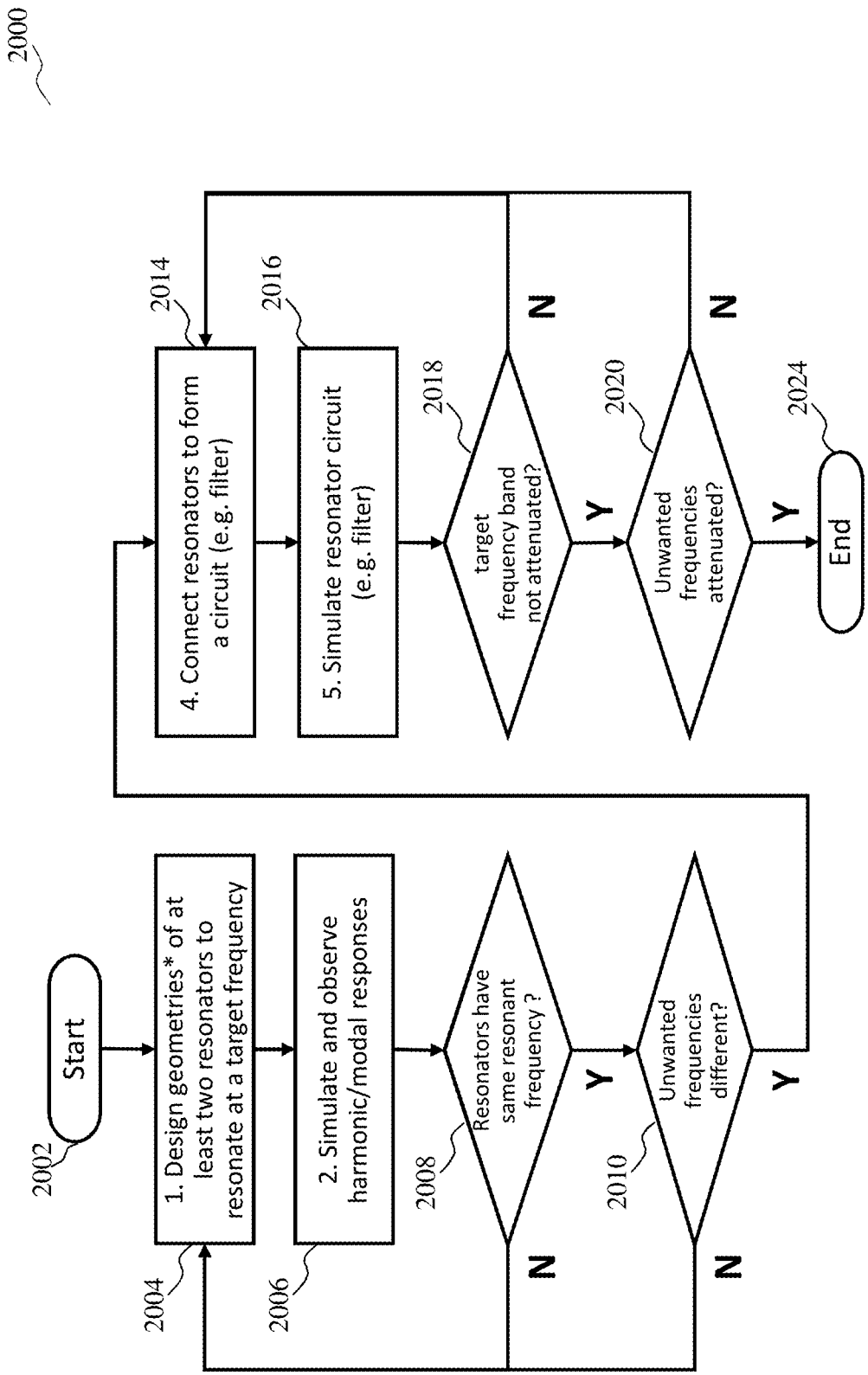
FIG. 20 illustrates a flow diagram of a method for decoupling unwanted acoustic modes according to various non-limiting embodiments.

FIG. 20 illustrates a flow diagram 2000 of a method for decoupling unwanted acoustic modes according to various non-limiting embodiments. The method may achieve the decoupling by connecting two or more acoustic resonators together to form a resonator circuit. The acoustic resonators may be IDTs 100. The resulting resonator circuit may be any one of the resonator devices 500, 900, 1100, 1300, 1500, or 1600. The method may begin at a first step 2002. From the first step 2002, the method may proceed to step 2004, in which geometries of at least two acoustic resonators may be designed to resonate at a common target frequency. Step 2004 may include selecting or varying various design parameters of the IDTs 100. These design parameters may include pitch and width, as well as the materials and thicknesses of layers in the IDTs. Step 2006 may include simulating and observing the harmonic and/or modal responses of the acoustic resonators from step 2004. Step 2008 may include determining based on the simulations from step 2006, whether the at least two acoustic resonators have the same resonant frequency. If the acoustic resonators do not have the same target frequency, the method may proceed to step 2004 to design new geometries for the acoustic resonators until the acoustic resonators achieve the same resonant frequency. Otherwise, the method may proceed to step 2010. Step 2010 may include determining based on the simulations from step 2006, whether the unwanted frequencies, i.e. the frequencies of the spurious peaks of the acoustic resonators are different. If the acoustic resonators have spurious peaks at the same frequencies, the method may proceed to step 2004 to design new geometries for the acoustic resonators until the acoustic resonators have spurious peaks at different frequencies. Otherwise, the method may proceed to step 2014. 2014 may include connecting the acoustic resonators designed at step 2004, to form the resonator circuit. Step 2016 may include simulating the resonator circuit formed at step 2016. Step 2018 may include determining based on the simulation results from step 2016, whether vibrations at the target frequency band remain unaffected, i.e. not attenuated. If the target frequency band is attenuated, the method may proceed to step 2014 to change the circuit connection or configuration. For example, the acoustic resonators may be re-arranged as to their positions in the circuit, or may be re-connected from series to parallel or vice versa. Otherwise, the method may proceed to step 2020. Step 2020 may include determining based on the simulation results from step 2016, whether the unwanted frequencies are attenuated. If the unwanted frequencies are attenuated, the method may be completed in step 2024. In other words, the resonator circuit formed in step 2014 may decouple unwanted acoustic modes. Otherwise, the method may proceed to step 2014 to change the circuit connection or configuration.

According to various non-limiting embodiments, a resonator device may include a first IDT and a second IDT that may be electrically connected to the first IDT. The resonator device may include, or may be part of, any one of the resonator devices 500, 900, 1100, 1300, 1500, and 1600. The first IDT and the second IDT may be configured to resonate at a common frequency. At least one of an electrode width and an electrode pitch of the first IDT may be different from the respective electrode width and/or electrode pitch of the second IDT. As a result of the difference in electrode pitch and/or width of the first IDT and the second IDT, spurious peaks of the resonator device may be lower in amplitude as compared to spurious peaks of each of the first IDT or the second IDT. The first IDT and the second IDT may be connected in series, like the IDTs 100a and 100b in the resonator devices 500, 900, 1100 and 1300. The first IDT and the second IDT may be connected in parallel, like the IDTs 100c or 100d with respect to the IDTs 100a and 100b in the resonator devices 900, 1100 and 1300. The first IDT and the second IDT may have a common bottom electrode, like described with respect to the resonator 1600. The first IDT and the second IDT may have a common piezoelectric layer, also like described with respect to the resonator 1600. The resonator device may further include a first plurality of IDTs connected in series and a second plurality of IDTs connected in shunt, like described with respect to the resonator devices 900, 1100 and 1300. Each IDT of the first plurality of IDTs may be configured to resonate at the common frequency. Each of the first IDT and the second IDT may be connected to the first plurality of IDTs in series, for example the first IDT may be one of the IDTs 100a and the second IDT may be one of the IDTs 100b in the resonator device 900, 1100 or 1300.

FIG. 21 illustrates a flow diagram 2100 of a method for fabricating a resonator device according to various non-limiting embodiments. Element 2102 may include providing a first IDT and a second IDT. The first IDT and the second IDT may be any one of the IDTs 100a, 100b, 100c, and 100d. Both the first IDT and the second IDT may have a common resonant frequency. Element 2104 may include electrically connecting the first IDT to the second IDT, for example, in series or in parallel. The first IDT may have at least one of an electrode width and an electrode pitch that is different from the corresponding electrode width and/or an electrode pitch of the second IDT, such that spurious peaks of the resonator device may be lower in amplitude as compared to the spurious peaks of each of the first interdigital transducers and the second interdigital transducer. In other words, the difference in pitch and/or width between the first IDT and the second IDT may result in attenuation of the spurious peaks, i.e. undesired signals. The resonator device that may be fabricated may include, or may be part of, any one of the resonator devices 500, 900, 1100, 1300, 1500 and 1600.

FIG. 22 illustrates a flow diagram 2200 of a method according to various non-limiting embodiments. The method may include, or may be part of, the method described with respect to FIG. 20. The method may be a method for decoupling unwanted modes in a resonator device. Element 2202 may include adjusting at least one of electrode pitches and/or electrode widths of a first IDT and a second IDT until each of the first IDT and the second IDT are configured to resonate at a common target frequency and are configured to produce spurious peaks at different frequencies. At least one of an electrode width and/or an electrode pitch of the first IDT may be different from the respective electrode width and/or electrode pitch of the second IDT. Element 2204 may include forming a resonator circuit that may include the first IDT electrically connected to the second IDT. Element 2206 may include determining a frequency response of the resonator circuit. Element 2208 may include changing electrical connections between the first IDT and the second IDT until spurious peaks of the resonator circuit in the determined frequency response are lower in amplitude as compared to the spurious peaks of each of the first IDT and the second IDT.

The following examples pertain to further embodiments.

Example 1 is a resonator device including: a first interdigital transducer; and a second interdigital transducer electrically connected to the first interdigital transducer; wherein both the first interdigital transducer and the second interdigital transducer are configured to resonate at a common frequency; and wherein at least one of an electrode width and an electrode pitch of the first interdigital transducer is different from the at least one of respective electrode width and electrode pitch of the second interdigital transducer such that spurious peaks of the resonator device are lower in amplitude as compared to spurious peaks of each of the first interdigital transducer and the second interdigital transducer.

In example 2, the subject-matter of example 1 can optionally include that the second interdigital transducer is electrically connected to the first interdigital transducer in series.

In example 3, the subject-matter of any one of examples 1 or 2 can optionally include that the second interdigital transducer is electrically connected to the first interdigital transducer in parallel.

In example 4, the subject-matter of any one of examples 1 to 3 can optionally include that the first interdigital transducer and the second interdigital transducer have a common bottom electrode.

In example 5, the subject-matter of any one of examples 1 to 4 can optionally include that the first interdigital transducer and the second interdigital transducer have a common piezoelectric layer.

In example 6, the subject-matter of any one of examples 1 to 5 can optionally include: a first plurality of interdigital transducers connected in series and a second plurality of interdigital transducers connected in shunt; wherein each interdigital transducer of the first plurality of interdigital transducers is configured to resonate at the common frequency.

In example 7, the subject-matter of example 6 can optionally include that each of the first interdigital transducer and the second interdigital transducer are connected to the first plurality of interdigital transducers in series.

In example 8, the subject-matter of any one of examples 6 to 7 can optionally include that each interdigitated transducer of the second plurality of interdigitated transducers is configured to resonate at a lower frequency than the common frequency.

In example 9, the subject-matter of any one of examples 1 to 8 can optionally include that the first interdigital transducer and the second interdigital transducer are formed on a single wafer.

In example 10, the subject-matter of any one of examples 1 to 9 can optionally include that the first interdigital transducer is configured to produce spurious peaks at different frequencies than the second interdigital transducer.

Example 11 is a method of fabricating a resonator device, the method including: providing a first interdigital transducer and a second interdigital transducer, wherein both the first interdigital transducer and the second interdigital transducer have a common resonant frequency; and electrically connecting the first interdigital transducer to the second interdigital transducer; wherein at least one of an electrode width and an electrode pitch of the first interdigital transducer is different from that of the second interdigital transducer such that spurious peaks of the resonator device are lower in amplitude as compared to the spurious peaks of each of the first interdigital transducers and the second interdigital transducer.

In example 12, the subject-matter of example 11 can optionally include that providing the first interdigital transducer and the second interdigital transducer includes: forming a piezoelectric layer over a bottom electrode layer; depositing an electrode material over the piezoelectric layer; and patterning the electrode material to form a pair of interdigitated electrodes for each of the first interdigital transducer and the second interdigital transducer, In example 13, the subject-matter of any one of examples 11 to 12 can optionally include that providing the first interdigital transducer and the second interdigital transducer includes: forming both the first interdigital transducer and the second interdigital transducer on a single wafer.

In example 14, the subject-matter of any one of examples 11 to 13 can optionally include: connecting a first plurality of interdigital transducers in series; connecting a second plurality of interdigital transducers in shunt; wherein each interdigital transducer of the first plurality of interdigital transducers is configured to resonate at the common frequency.

In example 15, the subject-matter of example 14 can optionally include: connecting each of the first interdigital transducer and the second interdigital transducer to the first plurality of interdigital transducers in series.

In example 16, the subject-matter of any one of examples 14 to 15 can optionally include that each interdigitated transducer of the second plurality of interdigitated transducers is configured to resonate at a lower frequency than the common frequency.

Example 17 is a method including: adjusting at least one of electrode pitches and electrode widths of a first interdigital transducer and a second interdigital transducer until each of the first interdigital transducer and the second interdigital transducer are configured to resonate at a common target frequency and are configured to produce spurious peaks at different frequencies; wherein at least one of an electrode width and an electrode pitch of the first interdigital transducer is different from the at least one of respective electrode width and electrode pitch of the second interdigital transducer; forming a resonator circuit including the first interdigital transducer electrically connected to the second interdigital transducer; determining a frequency response of the resonator circuit; and changing electrical connections between the first interdigital transducer and the second interdigital transducer until spurious peaks of the resonator circuit in the determined frequency response are lower in amplitude as compared to the spurious peaks of each of the first interdigital transducer and the second interdigital transducer.

In example 18, the subject-matter of example 17 can optionally include that each the first interdigital transducer and the second interdigital transducer includes a top electrode layer, a piezoelectric layer and bottom electrode layer, wherein the method further includes: varying thickness of at least one of the top electrode layer, a piezoelectric layer and bottom electrode layer of both the first interdigital transducer and the second interdigital transducer, until spurious peaks of the resonator circuit in the determined frequency response are lower in amplitude as compared to the spurious peaks of each of the first interdigital transducer and the second interdigital transducer.

In example 19, the subject-matter of any one of examples 17 to 18 can optionally include that each the first interdigital transducer and the second interdigital transducer includes a top electrode layer, a piezoelectric layer and bottom electrode layer, wherein the method further includes: varying thickness of at least one of the top electrode layer, a piezoelectric layer and bottom electrode layer of both the first interdigital transducer and the second interdigital transducer, until each of the first interdigital transducer and the second interdigital transducer are configured to resonate at a common target frequency and are configured to produce spurious peaks at different frequencies.

In example 20, the subject-matter of any one of examples 17 to 19 can optionally include: simulating harmonic responses of the first interdigital transducer and the second interdigital transducer to determine whether each of the first interdigital transducer and the second interdigital transducer are configured to resonate at the common target frequency and are configured to produce spurious peaks at different frequencies.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

It will be appreciated to a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The invention claimed is:

1. A resonator device comprising:
   a first interdigital transducer; and
   a second interdigital transducer electrically connected to the first interdigital transducer;
   wherein both the first interdigital transducer and the second interdigital transducer are configured to resonate at a common frequency;
   wherein each of the first interdigital transducer and the second interdigital transducer includes a pair of electrodes, each electrode having at least two fingers, wherein an electrode pitch of a respective interdigital transducer is a distance between two adjacent fingers of a same electrode, and an electrode width of the respective interdigital transducer is a width of each finger measured along a direction substantially parallel to the distance between the two adjacent fingers of the same electrode; and
   wherein an electrode width of the first interdigital transducer is different from an electrode width of the second interdigital transducer such that spurious peaks of the resonator device are lower in amplitude as compared to spurious peaks of each of the first interdigital transducer and the second interdigital transducer.

2. The resonator device of claim 1, wherein the second interdigital transducer is electrically connected to the first interdigital transducer in series.

3. The resonator device of claim 1, wherein the second interdigital transducer is electrically connected to the first interdigital transducer in parallel.

4. The resonator device of claim 1, wherein the first interdigital transducer and the second interdigital transducer have at least one of a common bottom electrode or a common piezoelectric layer.

5. The resonator device of claim 1, further comprising:
a first plurality of interdigital transducers connected in series and a second plurality of interdigital transducers connected in shunt;
wherein each interdigital transducer of the first plurality of interdigital transducers is configured to resonate at the common frequency.

6. The resonator device of claim 5, wherein each of the first interdigital transducer and the second interdigital transducer are connected to the first plurality of interdigital transducers in series.

7. The resonator device of claim 5, wherein each interdigital transducer of the second plurality of interdigital transducers is configured to resonate at a lower frequency than the common frequency.

8. The resonator device of claim 1, wherein the first interdigital transducer and the second interdigital transducer are formed on a single wafer.

9. The resonator device of claim 1, wherein the first interdigital transducer is configured to produce spurious peaks at different frequencies than the second interdigital transducer.

10. The resonator device of claim 2, further comprising:
a third interdigital transducer electrically connected directly to the first interdigital transducer and directly to the second interdigital transducer;
wherein an electrode pitch of the third interdigital transducer is different from the electrode pitch of the first interdigital transducer and from the electrode pitch of the second interdigital transducer.

11. The resonator device of claim 2, further comprising:
a third interdigital transducer and a fourth interdigital transducer both electrically connected in shunt with respect to the first interdigital transducer and the second interdigital transducer;
wherein an electrode pitch of the third interdigital transducer is different from an electrode pitch of the fourth interdigital transducer.

12. A method of fabricating a resonator device, the method comprising:
providing a first interdigital transducer and a second interdigital transducer,
wherein both the first interdigital transducer and the second interdigital transducer have a common resonant frequency; and
electrically connecting the first interdigital transducer to the second interdigital transducer;
wherein each of the first interdigital transducer and the second interdigital transducer includes a pair of electrodes, each electrode having at least two fingers, wherein an electrode pitch of a respective interdigital transducer is a distance between two adjacent fingers of a same electrode, and an electrode width of the respective interdigital transducer is a width of each finger measured along a direction substantially parallel to the distance between the two adjacent fingers of the same electrode;
wherein an electrode width of the first interdigital transducer is different from that of the second interdigital transducer such that spurious peaks of the resonator device are lower in amplitude as compared to spurious peaks of each of the first interdigital transducer and the second interdigital transducer.

13. The method of claim 12, wherein providing the first interdigital transducer and the second interdigital transducer comprises:
forming a piezoelectric layer over a bottom electrode layer;
depositing an electrode material over the piezoelectric layer; and
patterning the electrode material to form a pair of interdigital electrodes for each of the first interdigital transducer and the second interdigital transducer.

14. The method of claim 12, further comprising:
connecting a first plurality of interdigital transducers in series;
connecting a second plurality of interdigital transducers in shunt;
wherein each interdigital transducer of the first plurality of interdigital transducers is configured to resonate at the common resonant frequency.

15. The method of claim 14, further comprising:
connecting each of the first interdigital transducer and the second interdigital transducer to the first plurality of interdigital transducers in series.

16. The method of claim 14, wherein each interdigital transducer of the second plurality of interdigital transducers is configured to resonate at a lower frequency than the common resonant frequency.

17. A method comprising:
adjusting at least one of electrode pitches and electrode widths of a first interdigital transducer and a second interdigital transducer until each of the first interdigital transducer and the second interdigital transducer are configured to resonate at a common target frequency and are configured to produce spurious peaks at different frequencies;
wherein at least one of an electrode width and an electrode pitch of the first interdigital transducer is different from at least one of a respective electrode width and electrode pitch of the second interdigital transducer;
forming a resonator circuit comprising the first interdigital transducer electrically connected to the second interdigital transducer;
determining a frequency response of the resonator circuit; and
changing electrical connections between the first interdigital transducer and the second interdigital transducer until spurious peaks of the resonator circuit in the determined frequency response are lower in amplitude as compared to spurious peaks of each of the first interdigital transducer and the second interdigital transducer.

18. The method of claim 17, wherein each of the first interdigital transducer and the second interdigital transducer comprises a top electrode layer, a piezoelectric layer and a bottom electrode layer,
wherein the method further comprises:
varying a thickness of at least one of the top electrode layer, the piezoelectric layer and the bottom electrode layer of both the first interdigital transducer and the second interdigital transducer, until the spurious peaks of the resonator circuit in the determined frequency response are lower in amplitude as compared to the spurious peaks of each of the first interdigital transducer and the second interdigital transducer.

19. The method of claim 17, wherein each of the first interdigital transducer and the second interdigital transducer comprises a top electrode layer, a piezoelectric layer and a bottom electrode layer,
wherein the method further comprises:
varying a thickness of at least one of the top electrode layer, the piezoelectric layer and the bottom electrode layer of both the first interdigital transducer and the second interdigital transducer, until each of the first interdigital transducer and the second interdigital transducer are configured to resonate at the common target frequency and are configured to produce the spurious peaks at different frequencies.

20. The method of claim 17, further comprising:
simulating harmonic responses of the first interdigital transducer and the second interdigital transducer to determine whether each of the first interdigital transducer and the second interdigital transducer are configured to resonate at the common target frequency and are configured to produce the spurious peaks at different frequencies.

* * * * *